(12) United States Patent
Chen et al.

(10) Patent No.: US 9,847,511 B2
(45) Date of Patent: Dec. 19, 2017

(54) ENCAPSULATING FILM STACKS FOR OLED APPLICATIONS

(71) Applicant: Applied Materials, Inc., Santa Clara, CA (US)

(72) Inventors: Jrjyan Jerry Chen, Campbell, CA (US); Xiangxin Rui, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/149,785

(22) Filed: May 9, 2016

(65) Prior Publication Data

US 2016/0336542 A1    Nov. 17, 2016

Related U.S. Application Data

(60) Provisional application No. 62/172,784, filed on Jun. 8, 2015, provisional application No. 62/161,760, filed on May 14, 2015.

(51) Int. Cl.
| | | |
|---|---|---|
| *H01L 51/52* | (2006.01) | |
| *H01L 51/56* | (2006.01) | |
| *H01L 21/67* | (2006.01) | |
| *H01L 21/677* | (2006.01) | |
| *H01L 21/687* | (2006.01) | |

(52) U.S. Cl.
CPC ...... *H01L 51/5256* (2013.01); *H01L 21/6719* (2013.01); *H01L 21/67167* (2013.01); *H01L 21/67207* (2013.01); *H01L 21/67742* (2013.01); *H01L 21/68742* (2013.01); *H01L 21/68785* (2013.01); *H01L 21/68792* (2013.01)

(58) Field of Classification Search
CPC .......... H01L 51/5256; H01L 21/67167; H01L 21/6719; H01L 21/67742; H01L 21/68785; H01L 21/68792; H01L 21/68742; H01L 21/67207
USPC ........................................................ 257/100
See application file for complete search history.

(56) References Cited

U.S. PATENT DOCUMENTS

| | | |
|---|---|---|
| 2014/0065739 A1 | 3/2014 | Chen et al. |
| 2014/0117330 A1 | 5/2014 | Cho et al. |
| 2014/0246655 A1 | 9/2014 | Chen |
| 2015/0333293 A1 | 11/2015 | Poon et al. |

FOREIGN PATENT DOCUMENTS

| | | |
|---|---|---|
| KR | 20120043571 A | 5/2012 |
| KR | 20120094874 A | 8/2012 |

OTHER PUBLICATIONS

International Search Report and Written Opinion for PCT/US2016/031459 dated Aug. 11, 2016.

*Primary Examiner* — Caleen Sullivan
(74) *Attorney, Agent, or Firm* — Patterson + Sheridan LLP

(57) ABSTRACT

Embodiments described herein generally relate to a method and apparatus for encapsulating an OLED structure, more particularly, to a TFE structure for an OLED structure. The TFE structure includes at least one dielectric layer and at least two barrier layers, and the TFE structure is formed over the OLED structure. The at least one dielectric layer is deposited by atomic layer deposition (ALD). Having the at least one dielectric layer formed by ALD in the TFE structure improves the barrier performance of the TFE structure.

11 Claims, 14 Drawing Sheets

ENCAPSULATING FILM STACKS FOR OLED APPLICATIONS

CROSS-REFERENCE TO RELATED APPLICATIONS

This application claims benefit of U.S. Provisional Application Ser. No. 62/161,760 filed May 14, 2015 and U.S. Provisional Application Ser. No. 62/172,784 filed Jun. 8, 2015, which is incorporated by reference in its entirety.

BACKGROUND

Field

Embodiments described herein generally relate to a method and apparatus for encapsulating an organic light emitting diode (OLED) structure, more particularly, to a thin film encapsulation (TFE) structure for an OLED structure.

Description of the Related Art

Organic light emitting diode displays (OLED) have gained significant interest recently in display applications in view of their faster response times, larger viewing angles, higher contrast, lighter weight, lower power and amenability to flexible substrates. Generally, a conventional OLED is enabled by using one or more layers of organic materials sandwiched between two electrodes for emitting light. The one or more layers of organic materials include one layer capable of monopolar (hole) transport and another layer for electroluminescence and thus lower the required operating voltage for OLED display.

In addition to organic materials used in OLED, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), electrically pumped organic laser, and organic optical amplifier.

OLED structures may have a limited lifetime, characterized by a decrease in electroluminescence efficiency and an increase in drive voltage. A main reason for the degradation of OLED structures is the formation of non-emissive dark spots due to moisture or oxygen ingress. For this reason, OLED structures are typically encapsulated by a buffer layer sandwiched between barrier layers. The buffer layer is utilized to fill any voids or defects in the first barrier layer such that the second barrier layer has a substantially uniform surface for deposition. The buffer layer and the barrier layers may be fabricated from different materials including organic materials or inorganic materials as needed for different moisture resistance, film optical transparency and process requirements. However, different materials, especially organic and inorganic materials, often have different film properties, thereby resulting in poor surface adhesion at the interface where the organic and the inorganic layers are in contact with. Poor interface adhesion often allows film peeling or particle generation, thereby adversely contaminating the device structure and eventually leading to device failure. Additionally, poor adhesion at the interfaces between the organic and inorganic materials may also increase the likelihood of film cracking, thereby allowing the moisture or air to sneak into the device structure, thereby deteriorating the device electrical performance.

Therefore, an improved method and apparatus for encapsulating an OLED structure is needed.

SUMMARY

Embodiments described herein generally relate to a method and apparatus for encapsulating an OLED structure, more particularly, to a TFE structure for an OLED structure. The TFE structure includes at least one dielectric layer and at least two barrier layers, and the TFE structure is formed over the OLED structure. The at least one dielectric layer is deposited by atomic layer deposition (ALD). Having the at least dielectric layer formed by ALD in the TFE structure improves the barrier performance of the TFE structure while maintaining desired optical properties and film transparency.

In one embodiment, a TFE structure includes at least one dielectric layer that is formed by an ALD process, and at least two barrier layers.

In another embodiment, an OLED device includes an OLED structure, and a TFE structure formed over the OLED structure. The TFE structure includes at least one dielectric layer that is formed by an ALD process, and at least two barrier layers.

In another embodiment, a method includes forming a TFE structure over an OLED structure. The forming the TFE structure includes forming a first barrier layer using a chemical vapor deposition process, forming a first dielectric layer over the first barrier layer using an atomic layer deposition process, and forming a second barrier layer over the first dielectric layer using a chemical vapor deposition process.

In yet another embodiment, a cluster system for manufacturing a thin film encapsulation structure for a OLED device includes a cluster processing system comprising a transfer chamber, a load lock chamber coupled to the transfer chamber, wherein the load lock chamber is configured to transfer a substrate in a quadrilateral form from an ambient environment outside the cluster processing system to a vacuum environment inside the transfer chamber, and a plurality of processing chambers coupled to the transfer chamber configured to perform processes on the substrate, wherein the plurality of processing chambers include at least a chemical vapor deposition chamber and/or a physical vapor deposition chamber and an atomic layer deposition chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1C'-1E' are schematic cross sectional views of an OLED structure encapsulated by a TFE structure according to various embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a method and apparatus for encapsulating an OLED structure, more particularly, for manufacturing a TFE structure for encapsulating an OLED structure. The TFE structure includes at least one dielectric layer and at least two barrier layers, and the TFE structure is formed over the OLED structure. The at least one dielectric layer is deposited by atomic layer deposition (ALD). The dielectric layer formed by ALD process has desired film properties, such as relatively high film density as well as strong atomic bonding structures so that good moisture resistance, desired optical properties and the barrier performance of the TFE structure may be obtained and improved.

Figure 1A:
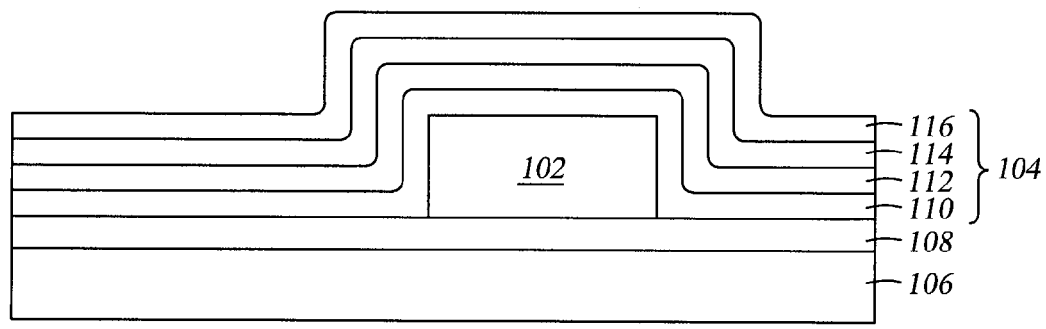
FIGS. 1A-1F are schematic cross sectional views of an OLED structure encapsulated by a TFE structure according to various embodiments described herein.

FIGS. 1A-1F are schematic cross sectional views of an OLED structure 102 encapsulated by a TFE structure 104 according to various embodiments described herein. As shown in FIG. 1A, the OLED structure 102 may be disposed over a substrate 106, and a contact layer 108 may be disposed between the substrate 106 and the OLED structure 102. The TFE structure 104 may include a first barrier layer 110 disposed on the OLED structure 102, a dielectric layer 112 disposed on the first barrier layer 110, a buffer layer 114 disposed on the dielectric layer 112, and a second barrier layer 116 disposed on the buffer layer 114.

In one example, the substrate 106 may be made of glass or plastic, such as polyethyleneterephthalate (PET) or polyethyleneterephthalate (PEN). The contact layer 108 may be made of silicon nitride (SiN) and/or silicon oxide ($SiO_2$).

The first barrier layer 110 may be an inorganic layer, such as a dielectric layer including silicon nitride (SiN), silicon oxynitride (SiON), silicon dioxide ($SiO_2$), aluminum oxide ($Al_2O_3$), aluminum nitride (AlN), or other suitable dielectric layer. In one embodiment, the first barrier layer 110 is a silicon nitride layer. The first barrier layer 110 may be deposited by a suitable deposition technique, such as chemical vapor deposition (CVD), PECVD, physical vapor deposition (PVD), spin-coating, or other suitable technique. The buffer layer 114 may be an organic layer, such as a hexamethyldisiloxane (HMDSO) layer, for example a fluorinated plasma-polymerized HMDSO (pp-HMDSO:F). The buffer layer 114 may be deposited by a suitable deposition technique, such as PECVD. The second barrier layer 116 may be an inorganic layer, such as a dielectric layer similar or identical to the first barrier layer 110, and the second barrier layer 116 may be deposited by a suitable deposition technique, such as CVD, PVD, ALD, spin-coating, or other suitable technique.

The TFE structure 104 includes at least one dielectric layer, such as the dielectric layer 112, that is deposited by ALD. As shown in FIG. 1A, the dielectric layer 112 is disposed between the first barrier layer 110 and the buffer layer 114. In the example wherein the first barrier layer 110 is not present, the dielectric layer 112 may be formed on the substrate 106 or the contact layer 108 directly and in direct contact with the OLED structure 102. The dielectric layer 112 may be an inorganic layer, such as an inorganic oxide layer, oxide layer, a silicon containing dielectric layer, a metal containing dielectric layer, or a multiple layer stack of any combinations of dielectric layers mentioned above or any suitable dielectric layer as needed. In one example, the dielectric layer 112 may be $Al_2O_3$, titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, SiON, AlN or any suitable inorganic layers.

In some embodiments, the dielectric layer 112 may include composite structures with multiple layers. The thickness of the dielectric layer 112 may range from about 100 Angstroms to about 600 Angstroms, such as about 300 Angstroms. It is believed that dielectric layer 112 formed by an atomic layer deposition (ALD) process may have film properties that may provide desired moisture resistance and film transparency. It is believed that the ALD process is enabled by a slow deposition process with a first monolayer of atoms being absorbed and adhered on a second monolayer of atoms formed on a carefully selected substrate surface. Strong adherence of atoms in each layers and absorbability of the layers of atoms onto the surface of substrate provide compact and secured bonding structures in the film structures so as to render a film property with a high film density (compared to a chemical vapor deposition process) that may efficiently prevent moisture or contaminant from penetrating therethrough. Furthermore, the slow ALD deposition rate of the dielectric layer 112 also allows the atoms from the dielectric layer 112 to gradually fill in the pinholes, pores, pits or defects that may be occurred from the substrate surface (e.g., the first barrier layer 110 in the examples of FIG. 1A) so as to assist repairing the film defects from the substrate surface. In contrast, the conventional plasma enhanced chemical vapor deposition process (PECVD) often provides a relatively fast deposition process with high throughput but renders relatively porous film structures for the resultant film layer. Thus, when utilizing such porous film structures from a conventional PECVD process as a barrier or passivation layer in an encapsulating structure, undesired contaminant, dust, or moistures from the air or environment often have a relatively high likelihood of sneaking into the porous structures or atomic vacancies in the deposited film layers, resulting in fast material structure degradation or film structure damage after a period of operation time. Thus, by utilizing the dielectric layer 112 formed by the ALD process, a film layer with high density that may be efficiently obtained, serving as a moisture resistance layer to prevent moisture from the air or environment to penetrate into the underlying OLED device 102 to undesirably alter the device performance. In the example wherein high throughput of the manufacturing cycles is desired, a plasma assisted atomic layer deposition (PE-ALD) process may be utilized instead to provide a relatively higher deposition rate (compared to ALD or thermal ALD) of deposition process while still maintaining the desired degree of film density.

In one example, the dielectric layer 112 may also have a wettability having a water contact angle less than 60 degrees so as to facilitate the layers subsequently formed thereon with high adhesion.

The dielectric layer formed by the ALD process may be disposed at different locations within the TFE structure 104. For example, in the example depicted FIG. 1B, the TFE structure 104 includes a dielectric layer 118 disposed on the OLED structure 102, the first barrier layer 110 disposed on the dielectric layer 118, the buffer layer 114 disposed on the first barrier layer 110, and the second barrier layer 116 disposed on the buffer layer 114. The dielectric layer 118 may be similar to the dielectric layer 112, and the dielectric layer 118 118 is also formed by an ALD process.

Figure 1B:
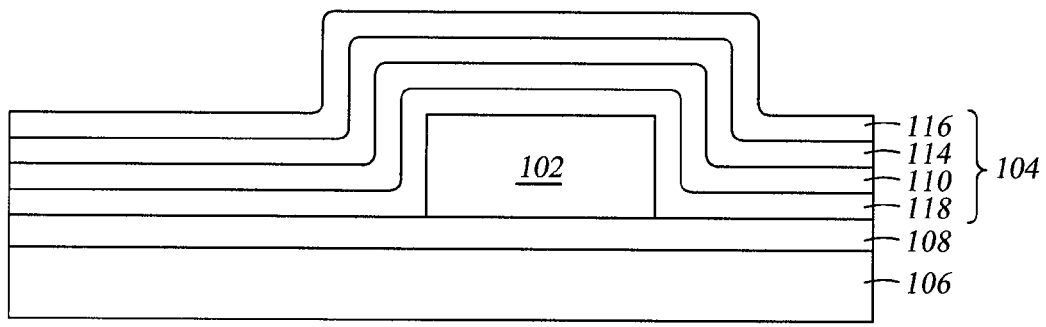
Figure 1C:
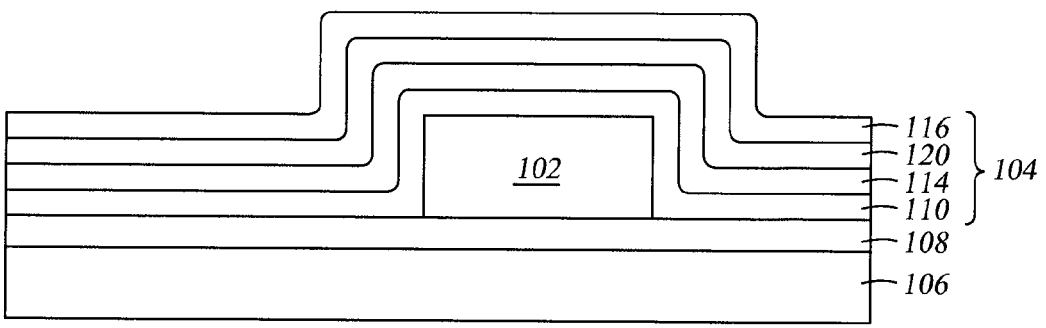
Figure 1C:
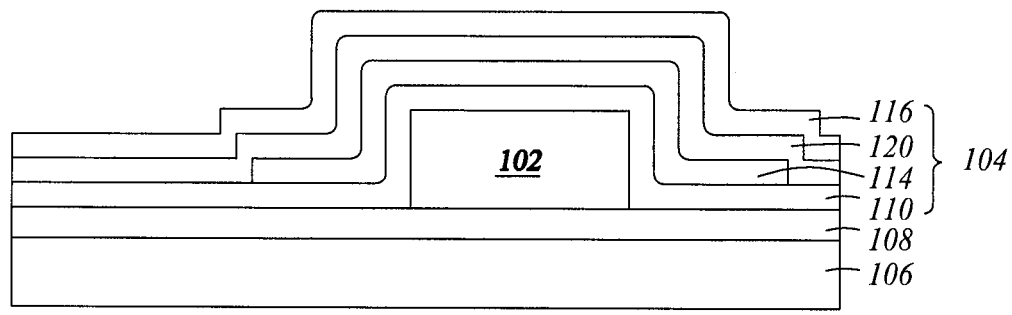

In the example depicted in FIG. 1C, the TFE structure 104 includes the first barrier layer 110 disposed on the OLED structure 102, the buffer layer 114 disposed on the first barrier layer 110, a dielectric layer 120 disposed on the buffer layer 114, and the second barrier layer 116 disposed on the dielectric layer 120. The dielectric layer 120 may be similar to the dielectric layer 112, and the dielectric 118 depicted in FIGS. 1A and 1B respectively and the dielectric layer 120 is also formed by an ALD process. In the example wherein the buffer layer 114 has a smaller dimension that does not substantially cover the entire surface of the first barrier layer 110, a portion of the dielectric layer 120 may be in direct contact with the underlying first barrier layer 110 where the buffer layer 114 is not present, as shown in in FIG. 1C'. Similarly, when the buffer layer 114 shown in FIGS. 1A and 1B also has a smaller dimension that does not substantially cover the entire surface of the dielectric layer 112 or the first barrier layer 110 respectively, a portion of the second barrier layer 116 may be in direct contact with the underlying dielectric layer 112 or the first barrier layer 110 where the buffer layer 114 is not present.

Figure 1D:
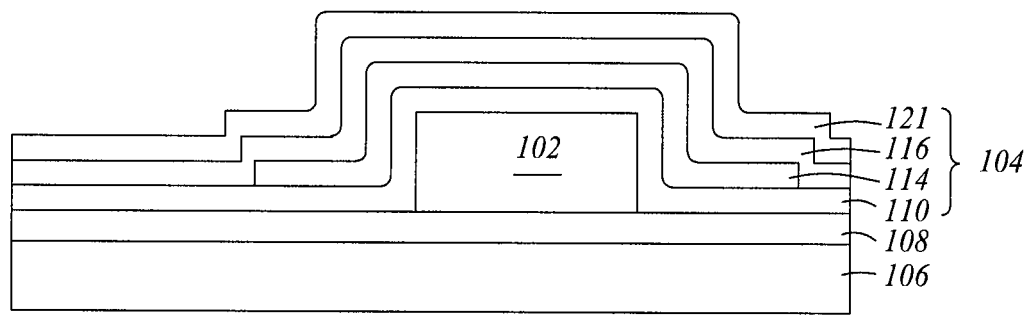

As shown in FIG. 1D, the TFE structure 104 includes the first barrier layer 110 disposed on the OLED structure 102, the buffer layer 114 disposed on the first barrier layer 110, the second barrier layer 116 disposed on the buffer layer 114, and a dielectric layer 121 disposed on the second barrier layer 116. Similarly, in the example where buffer layer 114 a smaller dimension that does not substantially cover the entire surface of the first barrier layer 110, a portion of the second barrier layer 116 may be in direct contact with the underlying first barrier layer 110 where the buffer layer 114 is not present, as shown in in FIG. 1D'. The dielectric layer 121 may be similar to the dielectric layer 112 depicted in FIG. 1A and the dielectric layer 121 is also formed by an ALD process.

Figure 1E:
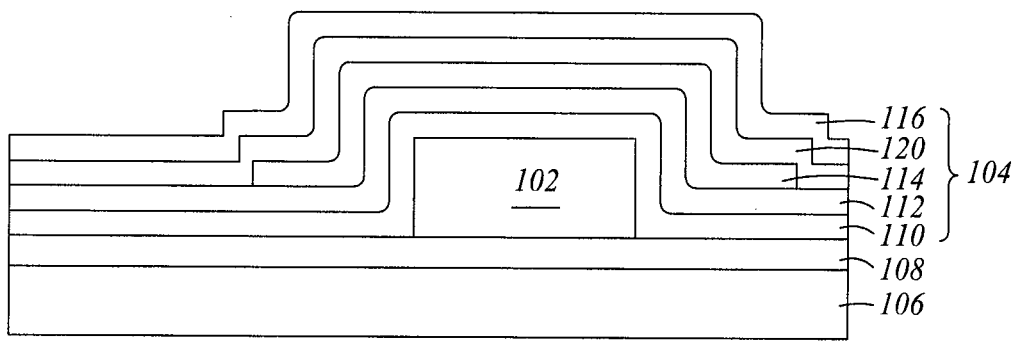
Figure 1D:
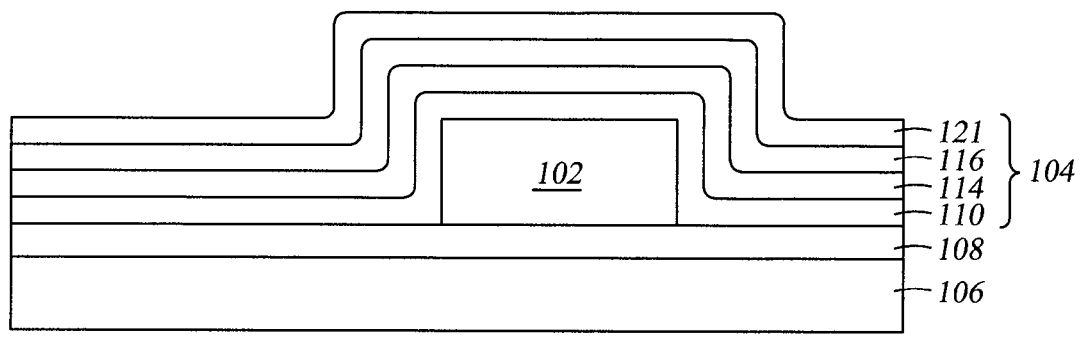
Figure 1E:
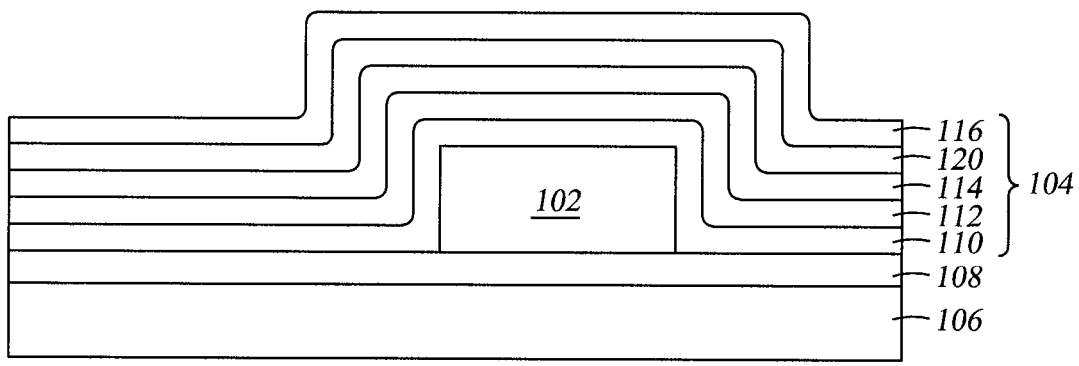

In some embodiments, the TFE structure 104 may include multiple dielectric layers that are formed by ALD processes. As shown in FIG. 1E, the TFE structure 104 includes the first barrier layer 110 disposed on the OLED structure 102, the dielectric layer 112 disposed on the first barrier layer 110, the buffer layer 114 disposed on the dielectric layer 112, the additional dielectric layer 120 disposed on the buffer layer 114, and the second barrier layer 116 disposed on the additional dielectric layer 120. The locations of the dielectric layers 112, 120 are not limited to between the first barrier layer 110 and the buffer layer 114 and between the buffer layer 114 and the second barrier layer 116, respectively. Similarly, in the example where buffer layer 114 a smaller dimension that does not substantially cover the entire surface of the dielectric layers 112, a portion of the additional dielectric layer 120 may be in direct contact with the underlying dielectric layers 112 where the buffer layer 114 is not present, as shown in in FIG. 1E'. Any combination of the dielectric layers shown in FIGS. 1A-1E may be suitable for the TFE structure 104.

Figure 1F:
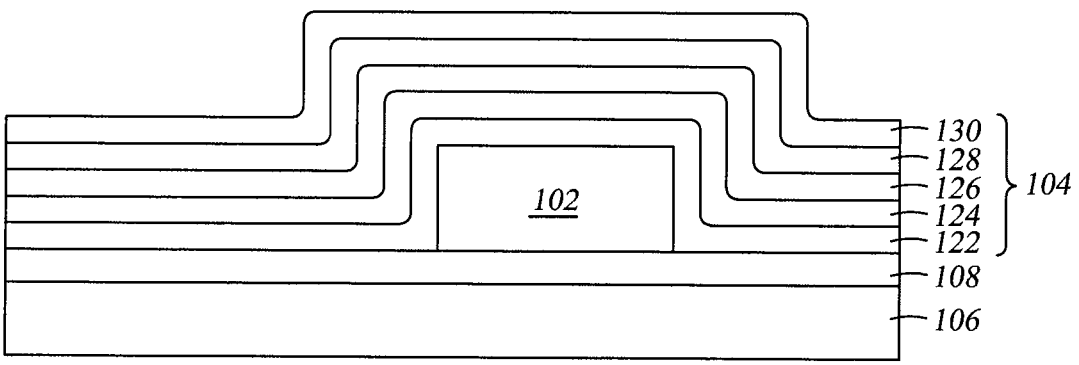

In some embodiments, the buffer layer 114 is not present in the TFE structure 104. In some embodiments, the TFE structure 104 may include a first barrier layer 122 disposed on the OLED structure 102, a first dielectric layer 124 disposed on the first barrier layer 122, and a second barrier layer 126 disposed on the first dielectric layer 124, as shown in FIG. 1F. The barrier layers 122, 126 may have a thickness of about 1200 Angstroms or less and the first dielectric layer 124 may have a thickness of about 600 Angstroms or less. In some embodiments, the TFE structure 104 further includes a second dielectric layer 128 disposed on the second barrier layer 126 and a third barrier layer 130 disposed on the second dielectric layer 128, as shown in FIG. 1F. The barrier layers 122, 126, 130 may have a thickness of about 800 Angstroms or less and the dielectric layers 124, 128 may have a thickness of about 300 Angstroms or less. Thus, the total thickness of the TFE structure 104 with three layers 122, 124, 126 may be the same as the total thickness of the TFE structure 104 with five layers 122, 124, 126, 128, 130. The barrier layers 122, 126, 130 may be similar to the barrier layer 110, and the dielectric layers 124, 128 may be similar to the dielectric layer 112 depicted in FIG. 1A. The dielectric layers 124, 128 are formed by an ALD process. With alternating barrier and ALD formed dielectric layers, the barrier performance of the TFE structure 104 with high moisture resistance as well as high optical film transparency are obtained.

Figure 2:
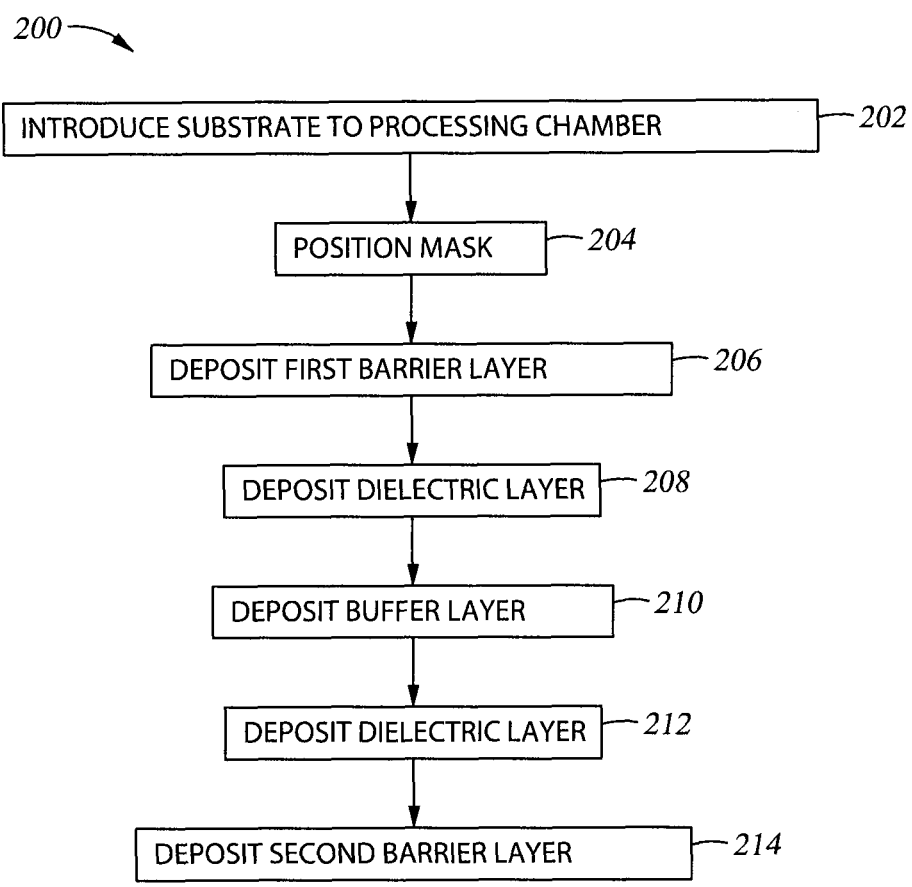
FIG. 2 is a flow diagram of a method for forming the TFE structure over the OLED structure according to various embodiments described herein.
Figure 3A:
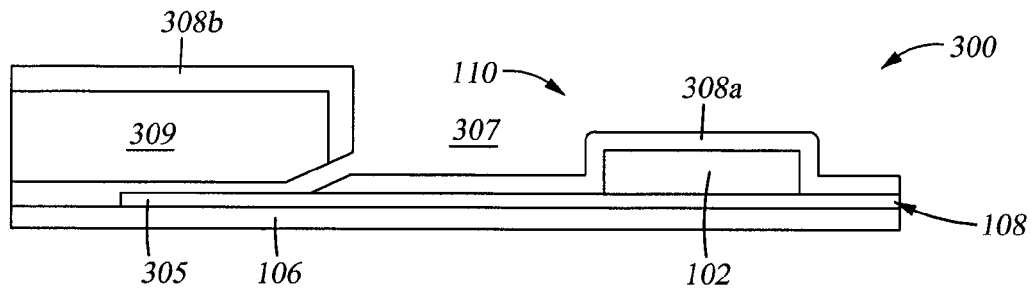
FIGS. 3A-3E illustrate schematic cross sectional views of an OLED device during different stages of the method of FIG. 2.

FIG. 2 is a flow diagram of a method 200 for forming the encapsulating structure 104 over the OLED structure 102 according to various embodiments described herein. FIGS. 3A-3E illustrate schematic cross sectional views of an OLED device 300 during different stages of the method 200 of FIG. 2. The method 200 starts at process 202 by introducing the substrate 106 having the preformed OLED structure 102 disposed thereon into a processing chamber. The substrate 106 may have the contact layer 108 disposed thereon, with the OLED structure 102 disposed on the contact layer 108, as shown in FIG. 3A.

At process 204, a mask 309 is aligned over the substrate 106 such that the OLED structure 102 is exposed through an opening 307 unprotected by the mask 309, as shown in FIG. 3A. The mask 309 is positioned such that a portion 305 of the contact layer 108 adjacent the OLED structure 102 is covered by the mask 309 so that any subsequently deposited material does not deposit on the portion 305. The portion 305 of the contact layer 108 is the electrical contact for the OLED device 300. The mask 309 may be made from a metal material, such as INVAR®.

At process 206, the first barrier layer 110 is deposited on the substrate 106, as shown in FIG. 3A. The first barrier layer 110 has a first portion 308a and a second portion 308b and a thickness of between about 5000 Angstroms and about 10000 Angstroms. The first portion 308a of the first barrier layer 110 is deposited through the opening 307 onto a region of the substrate 106 exposed by the mask 309, which includes the OLED structure 102 and a portion of the contact layer 108. The second portion 308b of the first barrier layer 110 is deposited on the mask 309 covering a second region of the substrate 106, which includes the portion 305 of the contact layer 108.

Figure 3B:
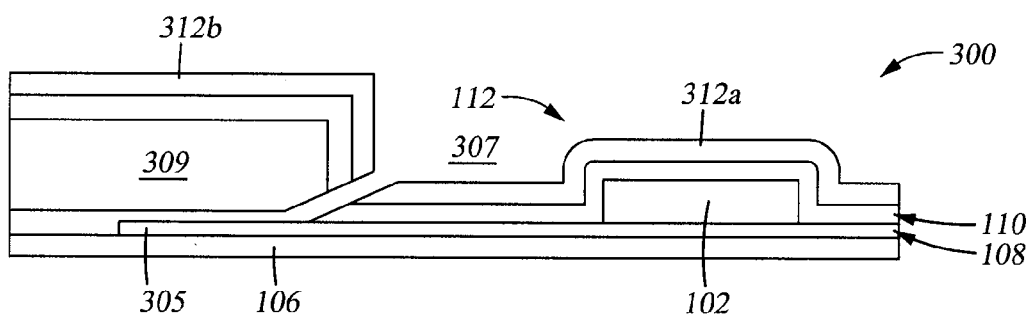

At process 208, after the first barrier layer 110 is formed on the substrate 106, the dielectric layer 112, such as an inorganic layer, is then formed on the first barrier layer 110 on the substrate 106, as shown in FIG. 3B. A first portion 312a of the dielectric layer 112 is deposited on the substrate 106 through the opening 307 of the mask 309 on the region of the substrate 106 exposed by the mask 309, covering the first portion 308a of the first barrier layer 110. A second portion 312b of the dielectric layer 112 is deposited on the second portion 308b of the first barrier layer 110 disposed on the mask 309, which covers the portion 305 of the contact layer 108.

The dielectric layer 112 may be deposited by an ALD process, such as plasma assisted ALD or thermal ALD. Atomic layer deposition (ALD) process is a deposition process with self-terminating/limiting growth. The ALD process yields a thickness of only a few angstroms or in a monolayer level for each cycle of deposition. The ALD process is controlled by sequentially distributing chemical and reactant into a processing chamber which is repeated in cycles. The thickness of the dielectric layer 112 formed by the ALD process depends on the number of the reaction cycles. The first reaction provides a first atomic layer of molecular layer being absorbed on the substrate and the second reaction provide a second atomic layer of molecular layer being absorbed on the first atomic layer.

In one embodiment, the dietetic layer 112 is an inorganic layer, such as an $Al_2O_3$ layer. The aluminum oxide ($Al_2O_3$) layer deposited has high thermal stability, good electrical resistivity, good moisture resistance and high purity as well as maintaining a desired degree of film transparency, thus making the aluminum oxide ($Al_2O_3$) layer as a good candidate for use as a barrier/blocking layer in an encapsulating structure for OLED. Other similar inorganic layer (including metal dielectric layer), such as titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, SiON, TiON and the like, having the similar film properties may also be utilized as such a barrier/blocking layer.

In one example, the precursors used in the ALD process for forming the $Al_2O_3$ layer includes at least a metal containing precursor, such as an aluminum containing gas, and a reacting gas. Suitable examples of the aluminum containing gas may have a formula of $R_xAl_yR'_zR''_v$ or $R_xAl_y(OR')_z$, where R, R' and R'' are H, $CH_3$, $C_2H_5$, $C_3H_7$, CO, NCO, alkyl or aryl group and x, y, z and v are integers having a range between 1 and 8. In another embodiment, the aluminum containing compound may have a formula of Al$(NRR')_3$, where R and R' may be H, $CH_3$, $C_2H_5$, $C_3H_7$, CO, NCO, alkyl or aryl group and R' may be H, $CH_3$, $C_2H_5$, $C_3H_7$, CO, NCO, alkyl or aryl group. Examples of suitable aluminum containing compounds are diethylalumium ethoxide ($Et_2AlOEt$), triethyl-tri-sec-butoxy dialumium ($Et_3Al_2OBu_3$, or EBDA), trimethylaluminum (TMA), trimethyldialumium ethoxide, dimethyl aluminum isupropoxide, disecbutoxy aluminum ethoxide, $(OR)_2AlR'$, wherein R, R' and R'' may be methyl, ethyl, propyl, isopropyl, butyl, isobutyl, tertiary butyl, and other alkyl groups having higher numbers of carbon atoms, and the like.

The reacting gas that may be supplied with the aluminum containing gas includes an oxygen containing gas, such as, oxygen ($O_2$), ozone ($O_3$), nitrogen ($N_2$), $N_2O$, NO, CO, $CO_2$ and among others.

It is noted that when the ALD process selected to form the dielectric layer 112 is a thermal ALD process, the resultant dielectric layer 112 tends to have a tensile stress film structure while the resultant dielectric layer 112 tends to have either compressive or tensile stress film structure when it is a plasma assisted ALD process based on different process parameters controlled. Thus, in the examples when the stress of the dielectric layer 112 is desired to be adjusted or altered at different stages of the deposition process, the ALD process as performed may be switched from thermal ALD to a plasma assisted ALD process (or vice versa) or switched process parameters during deposition as needed to adjust tensile/compressive film stress. The refractive index of the dielectric layer 112 is desired to be between 1.61 and 1.65, such as about 1.63.

Figure 3C:
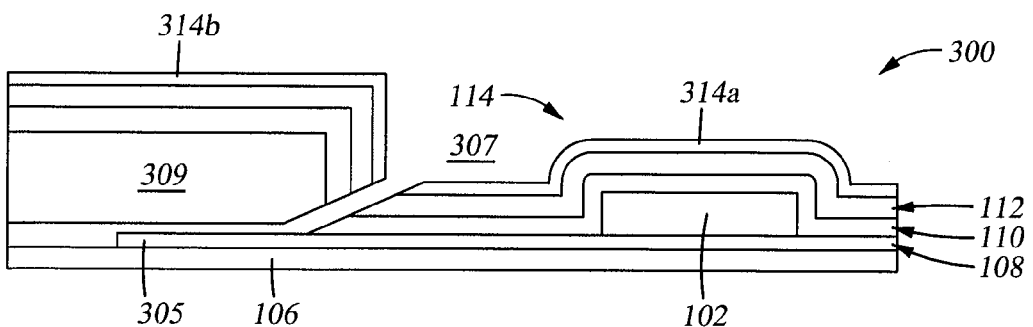

After depositing the dielectric layer 112, the buffer layer 114 is deposited in process 210 as shown in FIG. 3C. The buffer layer 114 may be HMDSO, such as pp-HMDSO:F, deposited in a PECVD chamber. A first portion 314a of the buffer layer 114 is deposited on the substrate 106 through the opening 307 of the mask 309 on the region of the substrate 106 exposed by the mask 309, covering the first portion 312a of the dielectric layer 112. A second portion 314b of the buffer layer 114 is deposited on the second portion 312b of the dielectric layer 112 disposed on the mask 309, which covers the portion 305 of the contact layer 108. The buffer layer 114 may have a thickness of between about 2 µm to about 5 µm.

Figure 3D:
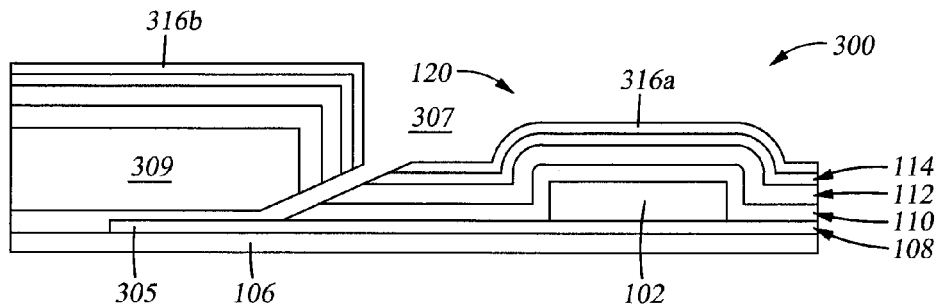

In some embodiments, the second dielectric layer 120 may be deposited on the buffer layer 114 in process 212 as shown in FIG. 3D. A first portion 316a of the dielectric layer 120 is deposited on the substrate 106 through the opening 307 of the mask 309 on the region of the substrate 106 exposed by the mask 309, covering the first portion 314a of the buffer layer 114. A second portion 316b of the dielectric layer 120 is deposited on the second portion 314b of the buffer layer 114 disposed on the mask 309, which covers the portion 305 of the contact layer 108. The dielectric layer 120 may be similar to the dielectric layer 112 and may be deposited by ALD process, such as plasma assisted ALD.

Figure 3E:
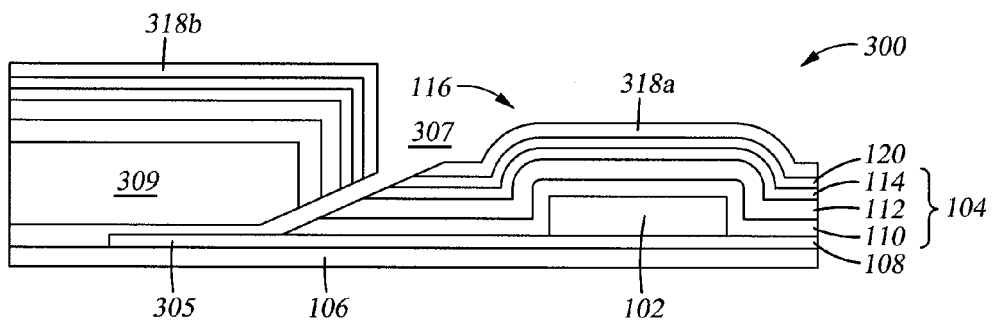

At process 214, the second barrier layer 116 is formed over the substrate 106, covering the dielectric layer 120, as shown in FIG. 3E. The second barrier layer 116 includes a first portion 318a deposited over the first portion 316a of the dielectric layer 120 and a second portion 318b deposited over the second portion 316b of the dielectric layer 120. The second barrier layer 116 may be a dielectric layer similar to the first barrier layer 110. As shown in FIG. 3E, the TFE structure 104 may include the first barrier layer 110, the first dielectric layer 112, the buffer layer 114, the second dielectric layer 120, and the second barrier layer 116. Alternatively, the TFE structure 104 may include a single dielectric layer as shown in FIGS. 1A, 1B, 1C, or multiple dielectric layers located at different locations within the TFE structure 104.

Figure 4:
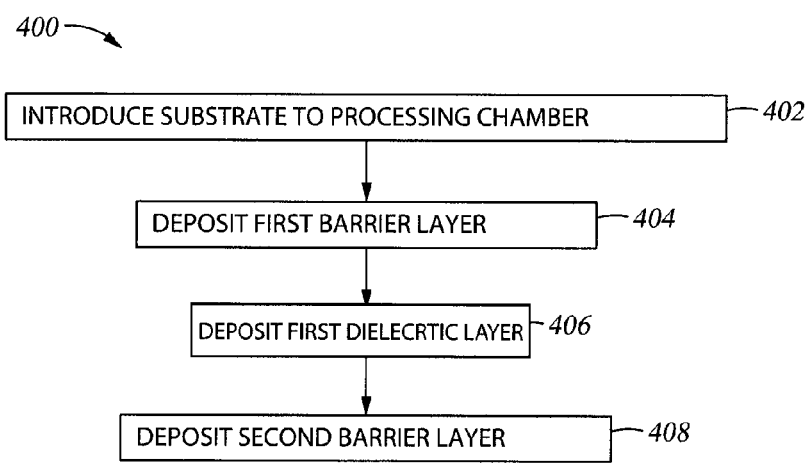
FIG. 4 is a flow diagram of a method for forming the TFE structure over the OLED structure according to various embodiments described herein.
Figure 5A:
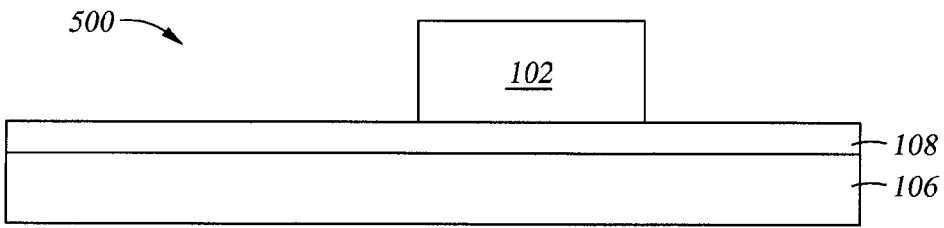
FIGS. 5A-5D illustrate schematic cross sectional views of an OLED device during different stages of the method of FIG. 2.

FIG. 4 is a flow diagram of a method 400 for forming the encapsulating structure 104 over the OLED structure 102 according to various embodiments described herein. FIGS. 5A-5D illustrate schematic cross sectional views of an OLED device 500 during different stages of the method 400 of FIG. 4. The method 400 starts at process 402 by introducing the substrate 106 having the preformed OLED structure 102 disposed thereon into a processing chamber. The substrate 106 may have the contact layer 108 disposed thereon, with the OLED structure 102 disposed on the contact layer 108, as shown in FIG. 5A.

Figure 5B:
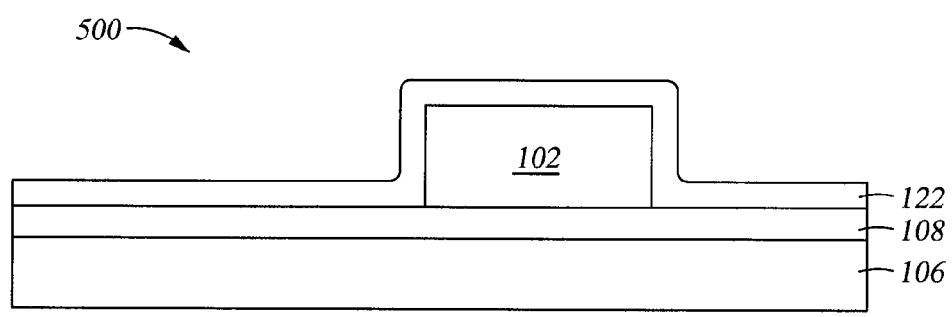
Figure 5C:
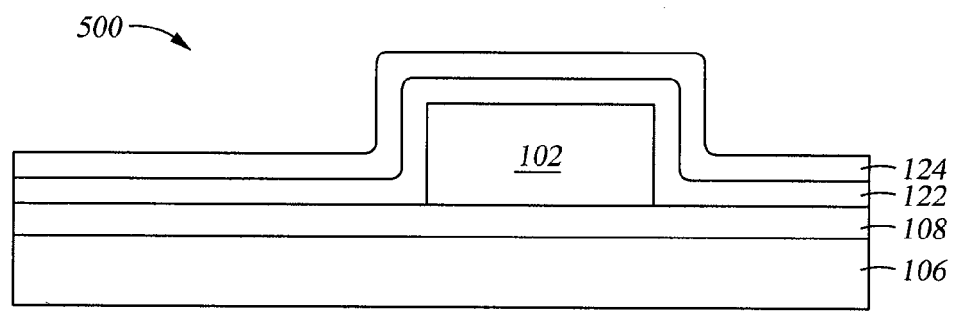
Figure 5D:
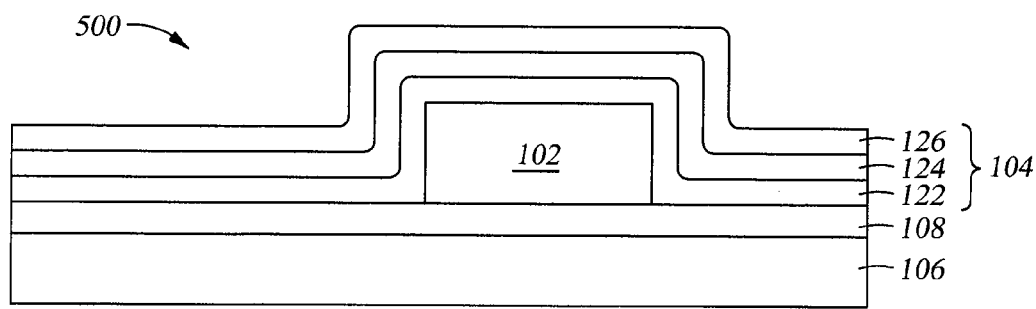

At process 404, the first barrier layer 122 is deposited on the OLED structure 102 and the contact layer 108, as shown in FIG. 5B. Unlike the method 200, the method 400 does not include the mask 309 covering a portion of the substrate 106. The first barrier layer 122 may be a silicon nitride layer having a thickness of about 1200 Angstroms. At process 406, the first dielectric layer 124 is deposited on the first barrier layer 122, as shown in FIG. 5C. The first dielectric layer 124 may be deposited by similar method as the dielectric layer 112. In one embodiment, the first dielectric layer 124 is an $Al_2O_3$ layer having a thickness of about 600 Angstroms. At process 408, the second barrier layer 126 is deposited on the first dielectric layer 124, as shown in FIG. 5D. The second barrier layer 126 may be a silicon nitride layer having a thickness of about 1200 Angstroms. As shown in FIG. 5D, the TFE structure 104 includes the first barrier layer 122, the first dielectric layer 124, and the second barrier layer 126. Alternatively, the TFE structure 104 may further include the second dielectric layer 128 and the third barrier layer 130, as shown in FIG. 1F.

Figure 6A:
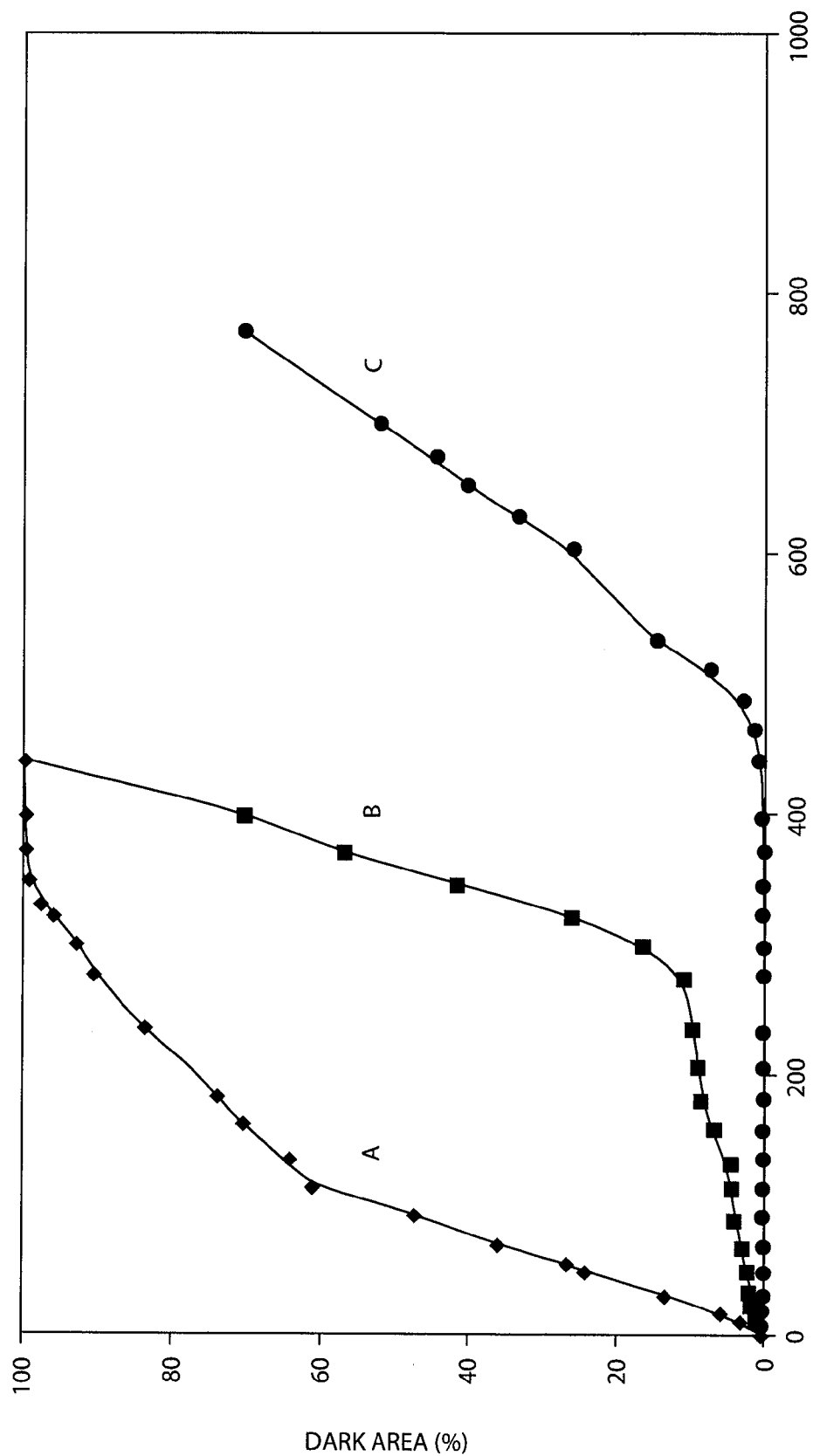
FIGS. 6A-6C are charts illustrating the benefit of having the TFE structure shown in FIGS. 1A-1F.
Figure 6B:
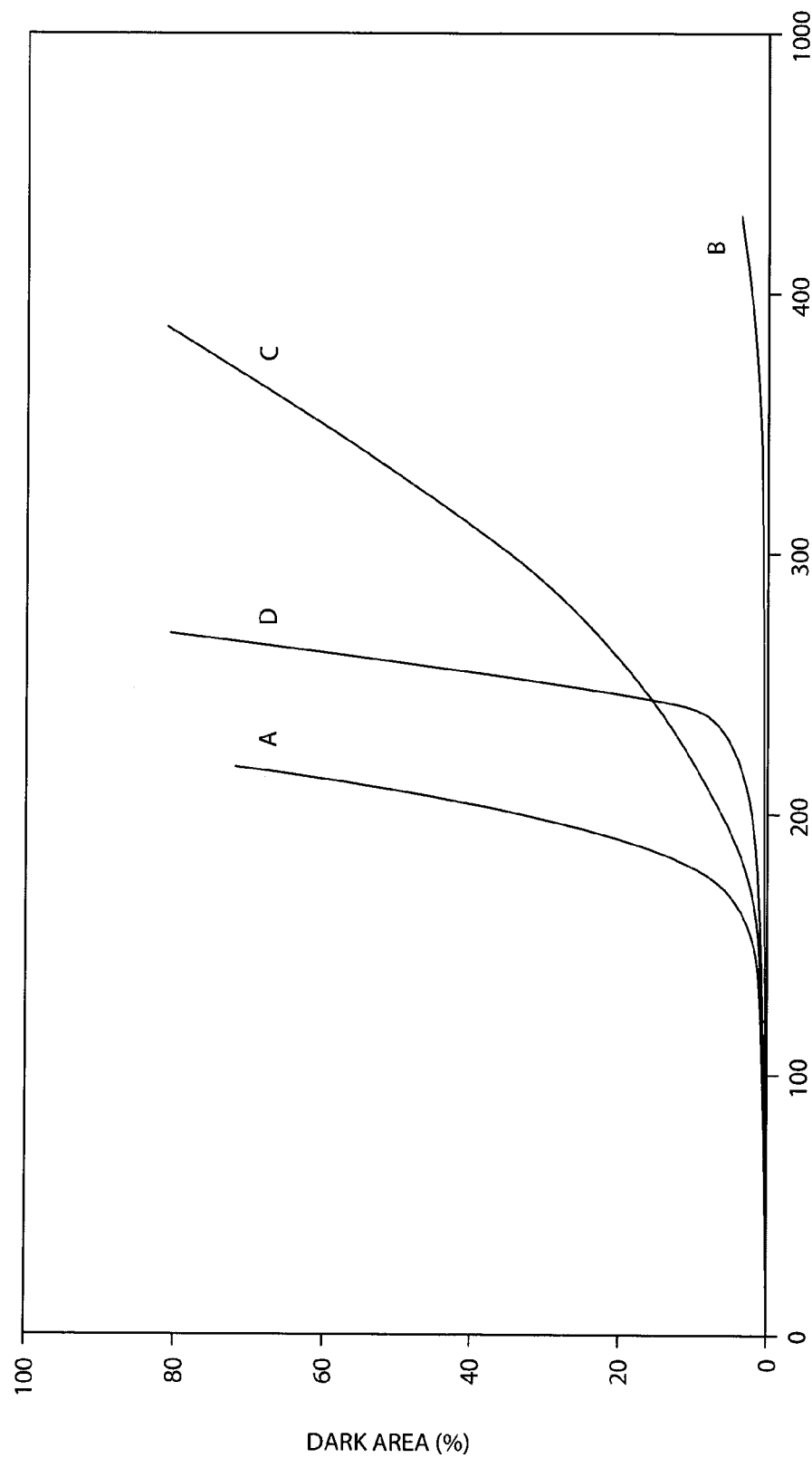
Figure 6C:
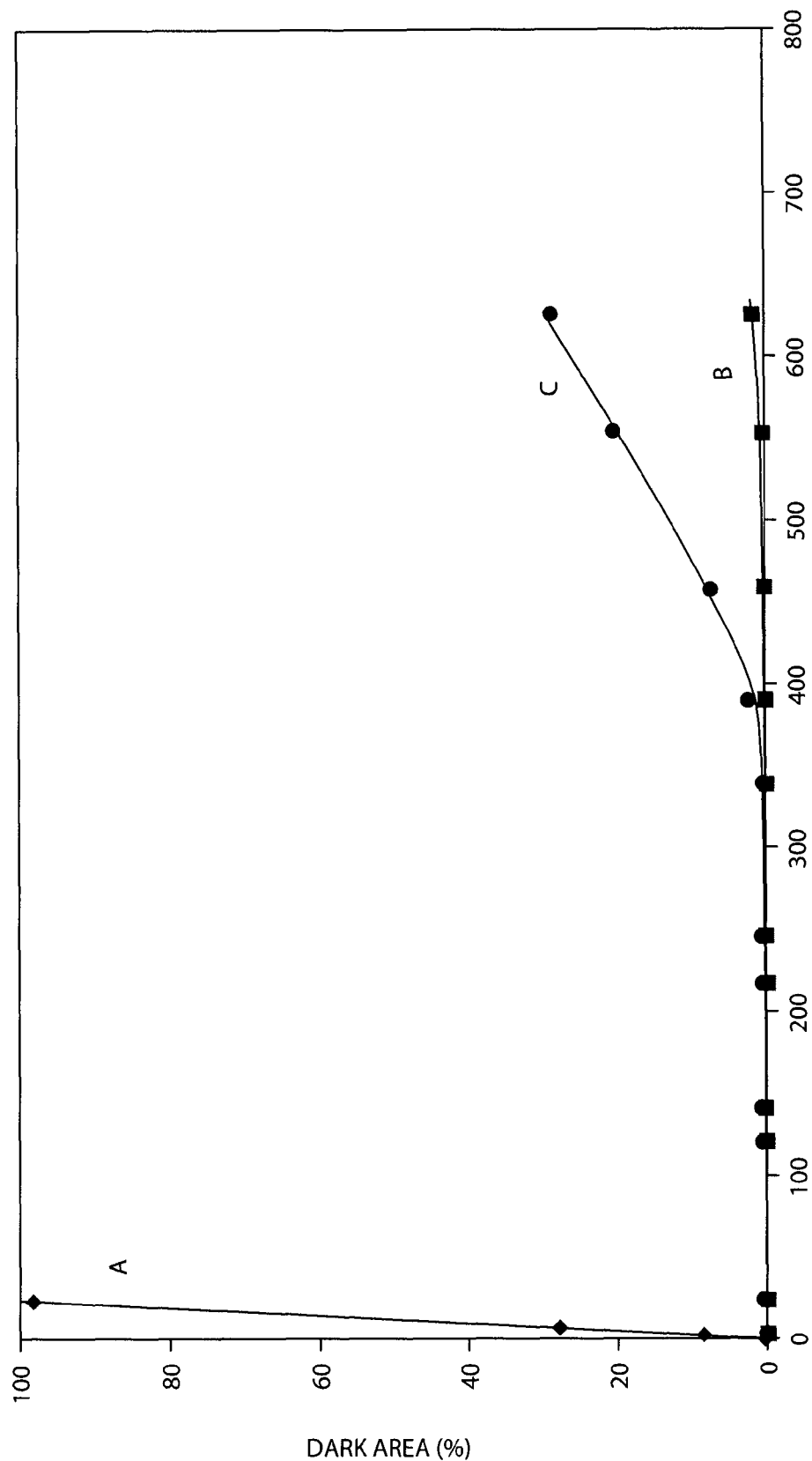

FIGS. 6A-6C are charts illustrating the benefit of having the TFE structure 104 shown in FIGS. 1A-1E. FIGS. 6A-6C depicts the dark area percentage found in the display device plotted as a function of OLED display device storage time in 60° C./90% relative humidity (RH) or 85° C./85% relative humidity (RH) environment. For FIG. 6A, each trace lines A, B, C indicates different dark area occurrence percentage verse OLED display device storage time in 85° C./85% relative humidity (RH) environment. Trace line A represents a TFE structure including two barrier layers, such as barrier layers 110, 116 without an ALD dielectric layer in between. Trace line B represents the TFE structure having three layers, including an ALD dielectric layer sandwiched between two barrier layers. The ALD dielectric layer may be the dielectric layer 124, the barrier layers may be barrier layers 122, 126. Trance line C represents the TFE structure having five layers, such as the TFE structure 104 shown in FIG. 1E. As shown in FIG. 6A, the TFE structure having the ALD dielectric layer formed therein, as indicated in trace line B and C, slows down the occurrence of the dark area on the display device. Thus, by utilizing the ALD dielectric layer in the TFE structure, the dark area occurrence rate is significantly reduced compared to the TFE structure without the ALD dielectric layer under the same amount of OLED display storage time in 85° C./85% relative humidity (RH) environment, thus efficiently increasing the service life time of the display device.

FIG. 6B also illustrates dark area percentages versus display device storage time in 60° C./90% relative humidity (RH) environment for four TFE structures used in an OLED device. Trace line A represents the TFE structure 104 shown in FIG. 1B, and the dielectric layer 118 has a thickness of about 300 Angstroms, the first barrier layer 110 has a thickness of about 2500 Angstroms, the buffer layer 114 has a thickness of about 1 micron, and the thickness of the second barrier layer 116 has a thickness of about 2500 Angstroms. Trance line B represents the TFE structure 104 shown in FIG. 1A, and the first barrier layer 110 has a thickness of about 2500 Angstroms, the dielectric layer 112 has a thickness of about 300 Angstroms, the buffer layer 114 has a thickness of about 1 micron, and the second barrier layer 116 has a thickness of about 2500 Angstroms. Trace line C represents the TFE structure 104 shown in FIG. 1C, and the first barrier layer 110 has a thickness of about 2500 Angstroms, the buffer layer 114 has a thickness of about 1 micron, the dielectric layer 120 has a thickness of about 300 Angstroms, and the second barrier layer 116 has a thickness of about 2500 Angstroms. Trace line D represents the TFE structure 104 shown in FIG. 1D, and the first barrier layer 110 has a thickness of about 2500 Angstroms, the buffer layer 114 has a thickness of about 1 micron, the second barrier layer 116 has a thickness of about 2500 Angstroms, and the dielectric layer 121 has a thickness of about 300 Angstroms. As shown in FIG. 6B, trace line B shows the longest operating time without dark area. In addition, all of the trace lines A, B, C, D show that for about 150 hours there are very small percentages of dark area. Comparing to trace line A in FIG. 6A, for the TFE structure does not include the ALD dielectric layer, there is about 60% of dark area at about 150 hours. Thus, by utilizing the ALD dielectric layer in the TFE structure, the dark area occurrence rate is significantly reduced compared to the TFE structure without the ALD dielectric layer under the same amount of OLED display operation time, thus efficiently increasing the service life time of the display device.

FIG. 6C also illustrates dark area percentages versus device storage time in 60 C/90 relative humidity (RH) environment for three TFE structures used in an OLED device. Trace line A represents a TFE structure including a 1.5 micron thick buffer layer, such as the buffer layer 114, sandwiched between two 300 Angstroms thick dielectric layers, such as dielectric layers 112, 120. Trace line B represents the TFE structure 104 shown in FIG. 1A, and the first barrier layer 110 has a thickness of about 7500 Angstroms, the dielectric layer 112 has a thickness of about 300 Angstroms, the buffer layer 114 has a thickness of about 1.5 micron, and the second barrier layer 116 has a thickness of about 7500 Angstroms. Trace line C represents the TFE structure 104 shown in FIG. 1A, and the first barrier layer 110 has a thickness of about 2500 Angstroms, the dielectric layer 112 has a thickness of about 300 Angstroms, the buffer layer 114 has a thickness of about 1.5 micron, and the second barrier layer 116 has a thickness of about 7500 Angstroms. As shown in FIG. 6C, trace line B shows the best barrier performance, i.e., has the longest life time without dark area formation.

Figure 7:
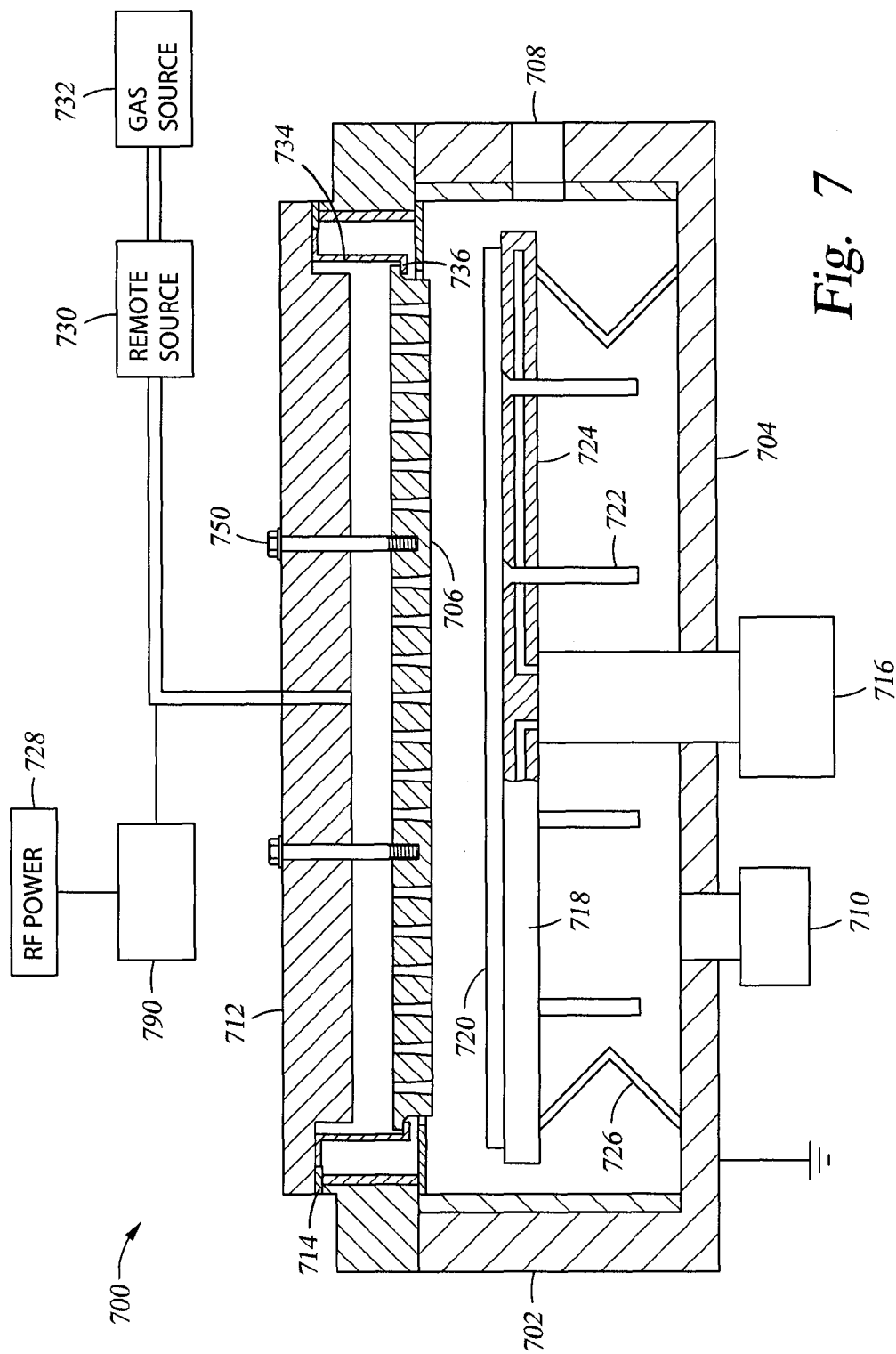
FIG. 7 is a schematic, cross sectional view of a PECVD chamber that may be used to perform the methods described herein.

FIG. 7 is a schematic, cross sectional view of a PECVD chamber 700 that may be used to perform the operations described herein. One or more films may be deposited onto a substrate 720 placed inside the PECVD chamber 700. The chamber 700 generally includes walls 702, a bottom 704 and a showerhead 706 which define a process volume. A substrate support 718 is disposed within the process volume. The process volume is accessed through a slit valve opening 708 such that the substrate 720 may be transferred in and out of the chamber 700. The substrate support 718 is coupled to an actuator 716 to raise and lower the substrate support 718. Lift pins 722 are moveably disposed through the substrate support 718 to move the substrate 720 to and from the substrate receiving surface. The substrate support 718 also includes heating and/or cooling elements 724 to maintain the substrate support 718 at a predetermined temperature. The substrate support 718 also includes RF return straps 726 to provide an RF return path at the periphery of the substrate support 718.

The showerhead 706 is coupled to a backing plate 712 by a fastening mechanism 750. The showerhead 706 is coupled to the backing plate 712 by one or more fastening mechanisms 750 to help prevent sag and/or control the straightness/curvature of the showerhead 706.

A gas source 732 is coupled to the backing plate 712 to provide gas through gas passages in the showerhead 706 to a processing area between the showerhead 706 and the substrate 720. A vacuum pump 710 is coupled to the chamber 700 to maintain the process volume at a predetermined pressure. An RF source 728 is coupled through a match network 790 to the backing plate 712 and/or to the showerhead 706 to provide an RF current to the showerhead 706. The RF current creates an electric field between the showerhead 706 and the substrate support 718 so that a plasma may be generated from the gases between the showerhead 706 and the substrate support 718.

A remote plasma source 730, such as an inductively coupled remote plasma source 730, is coupled between the gas source 732 and the backing plate 712. Between processing substrates, a cleaning gas may be provided to the remote plasma source 730 so that a remote plasma is generated. The radicals from the remote plasma may be provided to chamber 700 to clean chamber 700 components. The cleaning gas may be further excited by the RF source 728 provided to the showerhead 706.

The showerhead 706 is additionally coupled to the backing plate 712 by showerhead suspension 734. In one embodiment, the showerhead suspension 734 is a flexible metal skirt. The showerhead suspension 734 may have a lip 736 upon which the showerhead 706 may rest. The backing plate 712 may rest on an upper surface of a ledge 714 coupled with the chamber walls 702 to seal the chamber 700.

Figure 8:
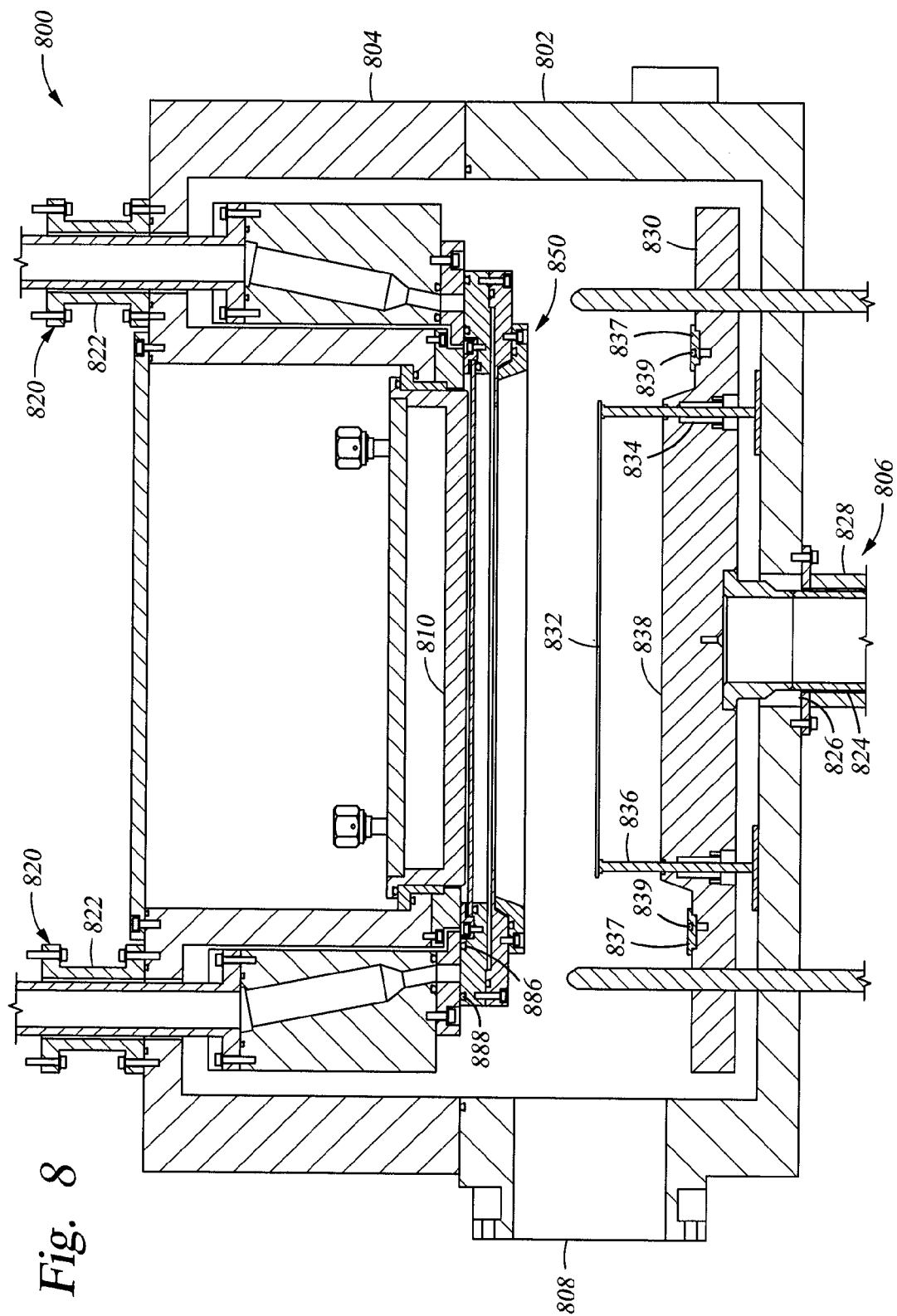
FIG. 8 is a schematic, cross sectional view of an ALD chamber that may be used to perform the methods described herein.

FIG. 8 is a schematic cross sectional view of an ALD chamber 800 that may be used to perform the operations described herein. The chamber 800 generally includes a chamber body 802, a lid assembly 804, a substrate support assembly 806, and a process kit 850. The lid assembly 804 is disposed on the chamber body 802, and the substrate support assembly 806 is at least partially disposed within the chamber body 802. The chamber body 802 includes a slit valve opening 808 formed in a sidewall thereof to provide access to the interior of the processing chamber 800. In some embodiments, the chamber body 802 includes one or more apertures that are in fluid communication with a vacuum system (e.g., a vacuum pump). The apertures provide an egress for gases within the chamber 800. The vacuum system is controlled by a process controller to maintain a pressure within the ALD chamber 800 suitable for ALD processes. The lid assembly 804 may include one or more differential pumps and purge assemblies 820. The differential pump and purge assemblies 820 are mounted to the lid assembly 804 with bellows 822. The bellows 822 allow the pump and purge assemblies 820 to move vertically with respect to the lid assembly 804 while still maintaining a seal against gas leaks. When the process kit 850 is raised into a processing position, a compliant first seal 886 and a compliant second seal 888 on the process kit 850 are brought into contact with the differential pump and purge assemblies 820. The differential pump and purge assemblies 820 are connected with a vacuum system (not shown) and maintained at a low pressure.

As shown in FIG. 8, the lid assembly 804 includes a RF cathode 810 that can generate a plasma of reactive species within the chamber 800 and/or within the process kit 850. The RF cathode 810 may be heated by electric heating elements (not shown), for example, and cooled by circulation of cooling fluids, for example. Any power source capable of activating the gases into reactive species and maintaining the plasma of reactive species may be used. For example, RF or microwave (MW) based power discharge techniques may be used. The activation may also be generated by a thermally based technique, a gas breakdown technique, a high intensity light source (e.g., UV energy), or exposure to an x-ray source.

The substrate support assembly 806 can be at least partially disposed within the chamber body 802. The substrate support assembly 806 can include a substrate support member or susceptor 830 to support a substrate 832 for processing within the chamber body. The susceptor 830 may be coupled to a substrate lift mechanism (not shown) through a shaft 824 or shafts 824 which extend through one or more openings 826 formed in a bottom surface of the chamber body 802. The substrate lift mechanism can be flexibly sealed to the chamber body 802 by a bellows 828 that prevents vacuum leakage from around the shafts 824. The substrate lift mechanism allows the susceptor 830 to be moved vertically within the ALD chamber 800 between a lower robot entry position, as shown, and processing, process kit transfer, and substrate transfer positions. In some embodiments, the substrate lift mechanism moves between fewer positions than those described.

In some embodiments, the substrate 832 may be secured to the susceptor using a vacuum chuck (not shown), an electrostatic chuck (not shown), or a mechanical clamp (not shown). The temperature of the susceptor 830 may be controlled (by, e.g., a process controller) during processing in the ALD chamber 800 to influence temperature of the substrate 832 and the process kit 850 to improve performance of the ALD processing. The susceptor 830 may be heated by, for example, electric heating elements (not shown) within the susceptor 830. The temperature of the susceptor 830 may be determined by pyrometers (not shown) in the chamber 800, for example.

As shown in FIG. 8, the susceptor 830 can include one or more bores 834 through the susceptor 830 to accommodate one or more lift pins 836. Each lift pin 836 is mounted so that they may slide freely within a bore 834. The support assembly 806 is movable such that the upper surface of the lift pins 836 can be located above the substrate support surface 838 of the susceptor 830 when the support assembly 806 is in a lower position. Conversely, the upper surface of the lift pins 836 is located below the upper surface 838 of the susceptor 830 when the support assembly 806 is in a raised position. When contacting the chamber body 802, the lift pins 836 push against a lower surface of the substrate 832, lifting the substrate off the susceptor 830. Conversely, the susceptor 830 may raise the substrate 832 off of the lift pins 836.

In some embodiments, the susceptor includes process kit insulation buttons 837 that may include one or more compliant seals 839. The process kit insulation buttons 837 may be used to carry the process kit 850 on the susceptor 830. The one or more compliant seals 839 in the process kit insulation buttons 837 are compressed when the susceptor lifts the process kit 850 into the processing position.

Figure 9:
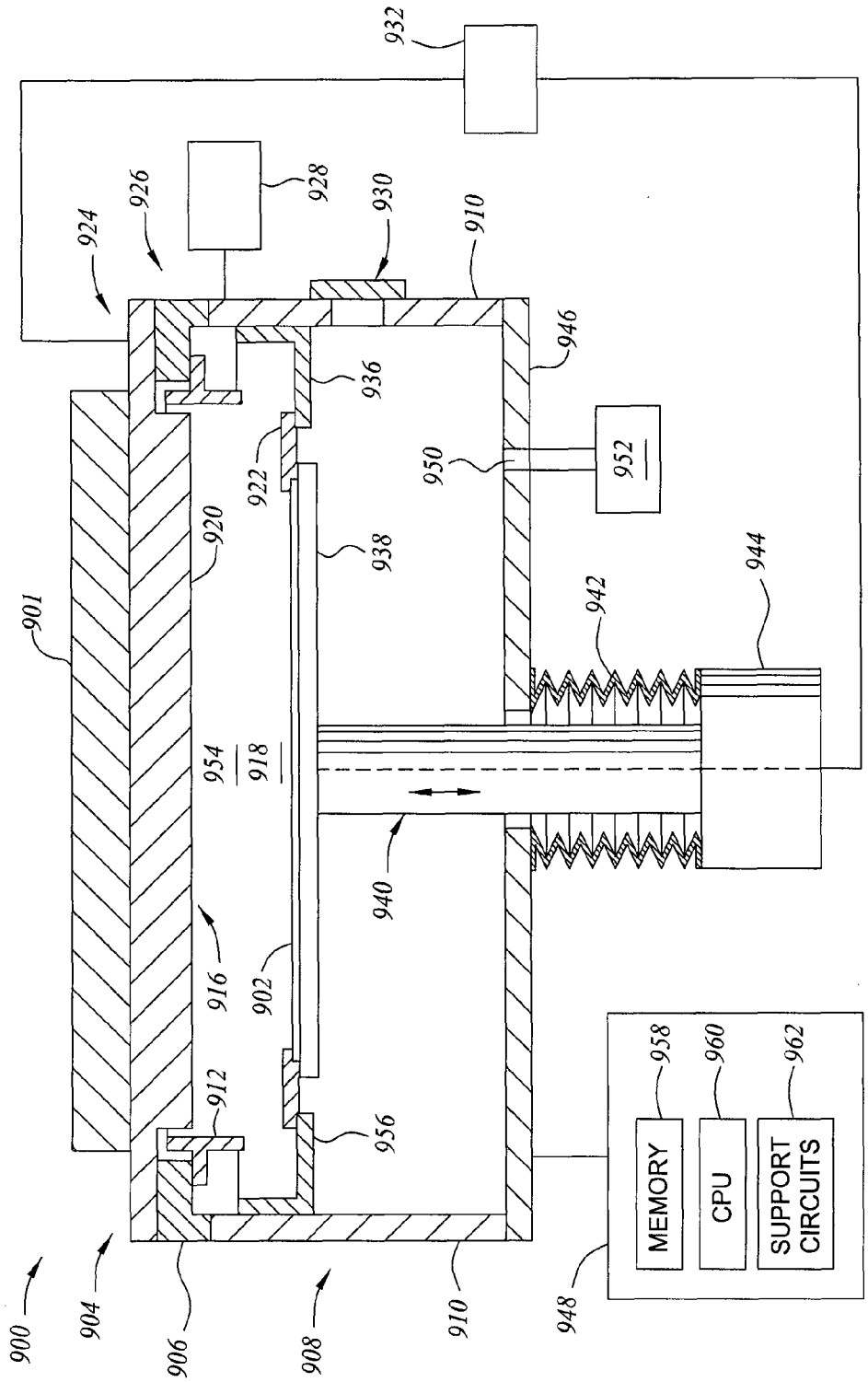
FIG. 9 is a schematic, cross sectional view of a PVD chamber that may be used to perform the methods described herein.

FIG. 9 illustrates an exemplary reactive sputter processing chamber 900 suitable for metal containing material. The processing chamber 900 may be part of a vacuum processing system 1000 having multiple processing chambers, which will be described latter below. One example of the process chamber that may be adapted to benefit from the disclosure is a physical vapor deposition (PVD) process chamber, available from Applied Materials, Inc., located in Santa Clara, Calif. It is contemplated that other sputter process chambers, including those from other manufactures, may be adapted to practice the present invention.

The processing chamber 900 includes a chamber body 908 having a processing volume 918 defined therein and enclosed by a lid assembly 904. The chamber body 908 has sidewalls 910 and a bottom 946. The dimensions of the chamber body 908 and related components of the process chamber 900 are not limited and generally are proportionally larger than the size of a substrate, to be processed therein. As such, any suitable substrate size may be processed in a suitable sized process chamber. Examples of suitable substrate sizes include substrates having a plan surface area of about 2000 or more square centimeters.

The chamber body 908 may be fabricated from aluminum or other suitable material. A substrate access port 930 is formed through the sidewall 910 of the chamber body 908, facilitating the transfer of the substrate 902 (i.e., a flat panel display substrate or a solar panel, a plastic or flexible substrate, a semiconductor wafer, or other workpiece) into and out of the process chamber 900. The access port 930 may be coupled to a transfer chamber and/or other chambers of a substrate processing system.

A gas source 928 is coupled to the chamber body 908 to supply process gases into the processing volume 918. Examples of process gases that may be provided by the gas source 928 include inert gases, non-reactive gases, and reactive gases. In one embodiment, process gases provided by the gas source 928 may include, but not limited to, argon gas (Ar), helium (He), nitrogen gas ($N_2$), oxygen gas ($O_2$), and $H_2O$, among others.

A pumping port 950 is formed through the bottom 946 of the chamber body 908. A pumping device 952 is coupled to the process volume 918 to evacuate and control the pressure therein. In one embodiment, the pressure level of the process chamber 900 may be maintained at about 1 Torr or less.

The lid assembly 904 generally includes a target 920 and a ground shield assembly 926 coupled or positioned proximate thereto. The target 920 provides a material source that can be sputtered and deposited onto the surface of the substrate 902 during a PVD process. The target 920 or target plate may be fabricated from a material utilized as a deposition specie. A high voltage power supply, such as a power source 932, is connected to the target 920 to facilitate sputtering materials from the target 920. In one embodiment, the target 920 may be fabricated from a metal containing material, such as titanium (Ti), tantalum (Ta), aluminum oxide ($Al_2O_3$), magnesium (Mg), silver (Si), indium (In), tin (Sn), indium tin oxide (ITO), indium tin oxide (ITO), indium zinc oxide (IZO), indium tin zinc oxide (ITZO), aluminum (Al), tungsten (W), gold (Au), molybdenum (Mo), mercury (Hg), chromium (Cr), metal, metal alloy or other suitable materials. In another embodiment, the target 920 may be fabricated by materials including indium tin alloy and the like.

The target 920 generally includes a peripheral portion 924 and a central portion 916. The peripheral portion 924 is disposed over the sidewalls 910 of the chamber 900. The central portion 916 of the target 920 may have a curvature surface slightly extending towards the surface of the substrate 902 disposed on a substrate support 938. The spacing between the target 920 and the substrate support 938 is maintained between about 50 mm and about 150 mm. It is noted that the dimension, shape, materials, configuration and diameter of the target 920 may be varied for specific process or substrate requirements. In one embodiment, the target 920 may further include a backing plate having a central portion bonded and/or fabricated from a material desired to be sputtered onto the substrate surface. The target 920 may also include a plurality of tiles or segment materials that together form the target.

The lid assembly 904 may further comprise a magnetron assembly 901 mounted above the target 920 which enhances efficient sputtering of material from the target 920 during processing. Examples of the magnetron assembly include a linear magnetron, a serpentine magnetron, a spiral magnetron, a double-digitated magnetron, a rectangularized spiral magnetron, among others.

The ground shield assembly 926 of the lid assembly 904 includes a ground frame 906 and a ground shield 912. The ground shield assembly 926 may also include other chamber shield members, target shield member, dark space shield, and dark space shield frame. The ground shield 912 is coupled to the peripheral portion 924 by the ground frame 906 defining an upper processing region 954 below the central portion 916 of the target 920 in the process volume 918. The ground frame 906 electrically insulates the ground shield 912 from the target 920 while providing a ground path to the chamber body 908 of the process chamber 900 through the sidewalls 910. The ground shield 912 constrains plasma generated during processing within the upper processing region 954 so that dislodged target source material from the central portion 916 of the target 920 is mainly deposited on the substrate surface rather than chamber sidewalls 910. In one embodiment, the ground shield 912 may be formed by one or more components.

A shaft 940 that extends through the bottom 946 of the chamber body 908 couples the substrate support 938 to a lift mechanism 944. The lift mechanism 944 is configured to move the substrate support 938 between a lower transfer position and an upper processing position. A bellows 942 circumscribes the shaft 940 and is coupled to the substrate support 938 to provide a flexible seal therebetween, thereby maintaining vacuum integrity of the chamber processing volume 918.

A shadow frame 922 is disposed on the periphery region of the substrate support 938 and is configured to confine deposition of source material sputtered from the target 920 to a desired portion of the substrate surface. When the substrate support 938 is in a lowered position, the shadow frame 922 is suspended above the substrate support 938 from a lip 956 of a chamber shield 936 that extends from the sidewall 910 of the chamber body 908. As the substrate support 938 is raised to the upper position for processing, an outer edge of the substrate 902 disposed on the substrate support 938 contacts the shadow frame 922, causing the shadow frame 922 to be lifted and spaced away from the chamber shield 936. In or while moving into the lowered position, lift pins (not shown) are selectively moved through the substrate support 938 to lift the substrate 902 above the substrate support 938 to facilitate access to the substrate 902 by a transfer robot or other suitable transfer mechanism.

A controller 948 is coupled to the processing chamber 900 and, optionally, the processing chamber 900. The controller 948 includes a central processing unit (CPU) 260, a memory 958, and support circuits 962. The controller 948 is utilized to control the process sequence, regulating the gas flows from the gas source 928 into the chamber 900 and controlling ion bombardment of the target 920. The CPU 960 may be of any form of a general purpose computer processor that can be used in an industrial setting. The software routines can be stored in the memory 958, such as random access memory, read only memory, floppy or hard disk drive, or other form of digital storage. The support circuits 962 are conventionally coupled to the CPU 960 and may comprise cache, clock circuits, input/output subsystems, power supplies, and the like. The software routines, when executed by the CPU 960, transform the CPU into a specific purpose computer (controller) 948 that controls the processing chamber 900 such that the processes are performed in accordance with the present invention. The software routines may also be stored and/or executed by a second controller (not shown) that is located remotely from the chamber 900.

During processing, the target 920 and the substrate support 938 are biased relative to each other by the power source 932 to maintain a plasma formed from the process gases supplied by the gas source 928. The ions from the plasma are accelerated toward and strike the target 920, causing target material to be dislodged from the target 920. The dislodged target material forms a layer on the substrate 902. In embodiments where certain process gases are supplied into the chamber 900, the dislodged target material and the process gases present in the chamber 900 react to forms a composite film on the substrate 902.

Figure 10:
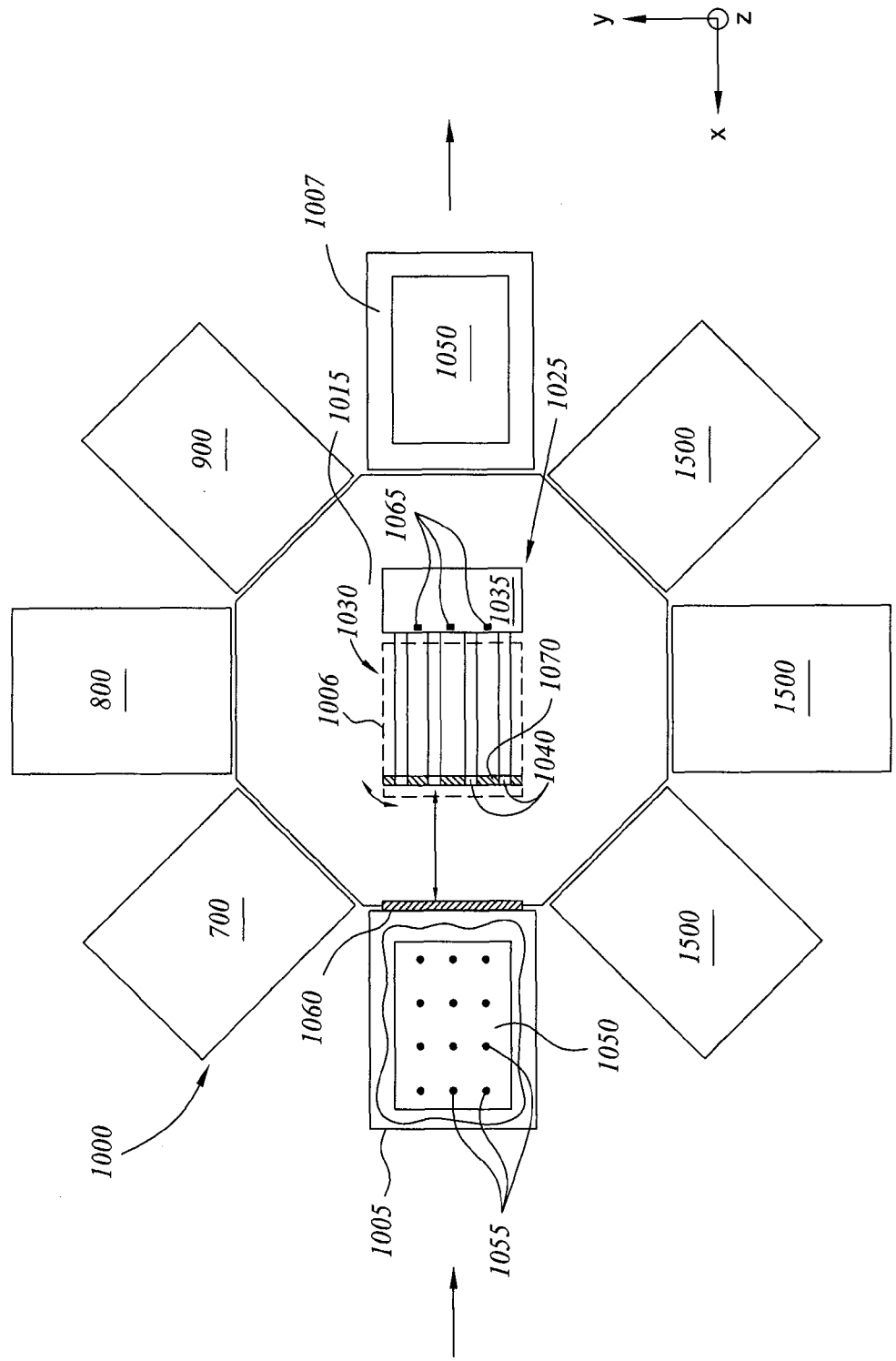
FIG. 10 is a schematic view of a multi-chamber substrate processing system including processing chambers described herein.

FIG. 10 is a top plan view of a multi-chamber substrate processing system 1000 suitable for the fabrication of organic light emitting diodes (OLEDS), thin-film transistors (TFT), and solar cell fabrication on flat media. The system 1000 includes a plurality of processing chambers 700, 800, 900, 1500 and one or more load lock chambers 1005, 1007 positioned around a central transfer chamber 1015. The processing chambers 700, 800, 900, 1500 may be configured to complete a number of different processing steps to achieve a desired processing of flat media, such as a large area substrate 1006 (outlined in dashed lines). The load lock chambers 1005, 1007 are configured to transfer a substrate in a quadrilateral form from an ambient environment outside the multi-chamber substrate processing system 1000 to a vacuum environment inside the transfer chamber 1015.

Positioned within the transfer chamber 1015 is a transfer robot 1025 having an end effector 1030. The end effector 1030 is configured to be supported and move independently of the transfer robot 1025 to transfer the substrate 1006. The end effector 1030 includes a wrist 1035 and a plurality of fingers 1040 adapted to support the substrate 1006. In one embodiment, the transfer robot 1025 is configured to be rotated about a vertical axis and/or linearly driven in a vertical direction (Z direction) while the end effector 1030 is configured to move linearly in a horizontal direction (X and/or Y direction) independent of and relative to the transfer robot 1025. For example, the transfer robot 1025 raises and lowers the end effector 1030 (Z direction) to various elevations within the transfer chamber 1015 to align the end effector 1030 with openings in the processing chambers 700, 800, 900, 1500 and the load lock chambers 1005, 1007. When the transfer robot 1025 is at a suitable elevation, the end effector 1030 is extended horizontally (X or Y direction) to transfer and/or position the substrate 1006 into and out of any one of the processing chambers 700, 800, 900, 1500 and the load lock chambers 1005, 1007. Additionally, the transfer robot 1025 may be rotated to align the end effector 1030 with other processing chambers 700, 800, 900, 1500 and the load lock chambers 1005, 1007.

In one example, the processing chambers 700, 800, 900, 1500 incorporated in the multi-chamber substrate processing system 1000 may be the plasma enhanced chemical vapor deposition (PECVD) chamber 700 depicted in FIG. 7, the atomic layer deposition (ALD) chamber 800 depicted in FIG. 8, or the physical vapor deposition (PVD) chamber 900 depicted in FIG. 9 or other suitable chambers, such as HDP-CVD, thermal annealing, surface treatment, electron beam (e-beam) treatment, plasma treatment, etching chambers, ion implantation chambers, surface cleaning chamber, metrology chambers, spin-coating chamber, polymer spinning deposition chamber or any suitable chambers as needed. In one example depicted in the multi-chamber substrate processing system 1000, the system 1000 includes the chemical vapor deposition (such as a PECVD) chamber 700, the atomic layer deposition (ALD) chamber 800, the physical vapor deposition (PVD) chamber 900 and other suitable chambers 1500 as needed. By such arrangement, the dielectric layer 112, 118, 120, 121, 124, 128 formed by the ALD process, the barrier layer 110, 116, 122, 126, 130 formed by the PECVD process, or the buffer layer 114 formed by a CVD process or a spin-coating process may also be integrated to perform in a single chamber without breaking vacuum so as to maintain cleanliness of the substrate without undesired contamination and residuals from the environment.

A portion of the interior of load lock chamber 1005 has been removed to expose a substrate support or susceptor 1050 that is adapted to receive and support the large area substrate 1006 during processing. The susceptor 1050 includes a plurality of lift pins 1055 that are movable relative to an upper surface of the susceptor 1050 to facilitate transfer of the large area substrate 1006. In one example of a transfer process of the large area substrate 1006, the lift pins 1055 are extended away from or above the upper surface of the susceptor 1050. The end effector 1030 extends in the X direction into the processing chamber 700, 800, 900, 1500 or load lock chambers 1005, 1007 above the extended lift pins. The transfer robot 1025 lowers the end effector 1030 in the Z direction until the large area substrate 1006 is supported by the lift pins 1055. The lift pins 1055 are spaced to allow the fingers 1040 of the end effector 1030 to pass the lift pins 1055 without interference. The end effector 1030 may be further lowered to assure clearance between the large area substrate 1006 and the fingers 140 and the end effector 1030 is retracted in the X direction into the transfer chamber 1015. The lift pins 1055 may be retracted to a position that is substantially flush with the upper surface of the susceptor 1050 in order to bring the large area substrate 1006 into contact with the susceptor 1050 so the susceptor 1050 supports the large area substrate 1006. A slit valve or door 1060 between the transfer chamber 1015 and the load lock chamber 1005, 1007 (or the processing chamber or 700, 800, 900, 1500) may be sealed and processing may be commenced in the load lock chamber 1005, 1007 (or the processing chamber or 700, 800, 900, 1500). To remove the large area substrate 1006 after processing, the transfer process may be reversed, wherein the lift pins 1055 raise the large area substrate 1006 and the end effector 1030 may retrieve the large area substrate 1006. In one example, the substrate 1006 may be transferred into the multi-chamber substrate processing system 1000 through the first load lock chamber 1005. After the substrate 1006 is oriented and aligned to a desired position, the substrate 1006 is then transferred to any one of the processing chambers 700, 800, 900, 1500 through the transfer chamber 1015 to perform any suitable processes as needed to form a device structure on the substrate 1006. After the processes are completed in the processing chambers 700, 800, 900, 1500, then the substrate 1006 is removed from and transferred out of the multi-chamber substrate processing system 1000 from the second load lock chamber 1007 as needed.

The environment in the substrate processing system 1000 is isolated from ambient pressure (i.e. pressure outside the system 1000) and is maintained at a negative pressure by one or more vacuum pumps (not shown). During processing, the processing chambers 700, 800, 900, 1500 are pumped down to pre-determined pressures configured to facilitate thin film deposition and other processes. Likewise, the transfer chamber 1015 is held at a reduced pressure during transfer of the large area substrates to facilitate a minimal pressure gradient between the processing chambers 700, 800, 900, 1500 and the transfer chamber 1015. In one embodiment, the pressure in the transfer chamber 1015 is maintained at a pressure lower than ambient pressure. For example, the pressure in the transfer chamber may be about 7 Torr to about 10 Torr while the pressure in the processing chambers 700, 800, 900, 1500 may be lower. In one embodiment, the maintained pressure within the transfer chamber 1015 may be substantially equal to the pressure within the processing chambers 700, 800, 900, 1500 and/or load lock chambers 1005 and 1007 to facilitate a substantially equalized pressure in the system 1000

During the transfer of the large area substrate 1006 in the transfer chamber 1015 and the processing chambers 700, 800, 900, 1500, proper alignment of the large area substrate 1006 is crucial to prevent collisions and/or damage of the large area substrate 1006. Additionally, the interior of the system 1000 must be kept clean and free from debris such as broken pieces of a substrate, broken equipment, and other particulate contamination. While some conventional systems include view windows allowing line of sight viewing into the interior of the various chambers 700, 800, 900, 1500, the windows may not allow a full view and/or precise inspection of the large area substrates and the interior of the various chambers 700, 800, 900, 1500. Also, the conventional systems are not configured to view the large area substrate 1006 and provide a metric of processing results while the large area substrates are in the system.

The transfer robot 1025 includes one or more optical image sensors 1065 and 1070 disposed on the transfer robot 1025 as needed. The one or more optical image sensors 1065, 1070 may be optical scanners, imagers or cameras, such as a charged-coupled device (CCD), a complimentary metal oxide semiconductor (CMOS) device, a video camera, and the like. In one embodiment, one or more of the optical image sensors 1065, 1070 are mounted on the transfer robot 1025 in a position to view the large area substrate 1006, the fingers 1040 and any object in the line of sight view of the sensors 1065, 1070. In this embodiment, the image sensors 1065, 1070 may be oriented to view objects substantially in the X and Y direction as well as the Z direction as the transfer robot 1025 is stationary or moving in the system 1000. The image sensors 1065, 1070 may include wide angle optics, such as a fisheye lens, to enable a greater field of view.

In summary, an OLED structure is encapsulated by a TFE structure. The TFE structure includes a dielectric layer formed by ALD and at least two barrier layers. By including an additional dielectric layer formed by ALD in the TFE structure, the barrier performance of the TFE structure is improved.

While the foregoing is directed to embodiments of the present disclosure, other and further embodiments of the disclosure may be devised without departing from the basic scope thereof, and the scope thereof is determined by the claims that follow.

The invention claimed is:

1. A thin film encapsulation structure, comprising:
   at least two dielectric layers, at least one of the two dielectric layers is formed by an atomic layer deposition process;
   at least two barrier layers, wherein the at least two dielectric layers are sandwiched between the at least two barrier layers, wherein the dielectric layers comprise different materials than that of the barrier layers; and
   a buffer layer disposed between the at least two barrier layers and above one of the dielectric layers, wherein the at least two barrier layers includes a first barrier layer and a second barrier layer, and at least one of the dielectric layers is disposed on the first barrier layer, and the second barrier layer is disposed on the buffer layer, and at least one of the dielectric layers is disposed on the buffer layer.

2. The thin film encapsulation structure of claim 1, wherein the barrier layers have similar film properties.

3. The thin film encapsulation structure of claim 2, wherein the at least one of the dielectric layers is an aluminum oxide layer and the at least two barrier layers are silicon nitride layers.

4. The thin film encapsulation structure of claim 1, wherein the buffer layer is a hexamethyldisiloxane layer.

5. The thin film encapsulation structure of claim 1, wherein the at least two dielectric layers includes a first inorganic layer and a second inorganic layer.

6. The thin film encapsulation structure of claim 5, wherein the first inorganic layer is disposed on the first barrier layer, the buffer layer is disposed on the first inorganic layer, the second inorganic layer is disposed on the buffer layer, and the second barrier layer is disposed on the second inorganic layer.

7. A thin film encapsulation structure comprising:
   at least two dielectric layers, at least one of the two dielectric layers is formed by an atomic layer deposition process;
   at least two barrier layers, wherein the at least two dielectric layers are sandwiched between the at least two barrier layers, wherein the dielectric layers comprise different materials than that of the barrier layers, wherein the at least two dielectric layers includes a first inorganic layer and a second inorganic layer, the at least two barrier layers include a first barrier layer, a second barrier layer, and a third barrier layer, wherein the first inorganic layer is disposed on the first barrier layer, the second barrier layer is disposed on the first inorganic layer, the second inorganic layer is disposed on the second barrier layer, and the third barrier layer is disposed on the second inorganic layer.

8. An OLED device, comprising:
   an OLED structure; and
   a thin film encapsulation structure formed over the OLED structure, wherein the thin film encapsulation structure comprises:
      at least two dielectric layers, one of the at least two dielectric layers that is formed by an atomic layer deposition process; and
      at least two barrier layers with similar film properties, wherein the at least two dielectric layers are sandwiched between the at least two barrier layers, wherein the dielectric layers comprise different materials than that of the barrier layers, wherein the at least two dielectric layers includes a first inorganic layer and a second inorganic layer, the at least two barrier layers include a first barrier layer, a second barrier layer, and a third barrier layer, wherein the first inorganic layer is disposed on the first barrier layer, the second barrier layer is disposed on the first inorganic layer, the second inorganic layer is disposed on the second barrier layer, and the third barrier layer is disposed on the second inorganic layer.

9. The OLED device of claim 8, wherein the thin film encapsulation structure further comprises a buffer layer disposed between the at least two barrier layers.

10. The OLED device of claim 9, wherein the first inorganic layer is disposed on the first barrier layer, the buffer layer is disposed on the first inorganic layer, and the second barrier layer is disposed on the buffer layer.

11. The OLED device of claim 10, wherein the second inorganic layer is disposed between the buffer layer and the second barrier layer.

* * * * *